(12) United States Patent
Anthes et al.

(10) Patent No.: US 6,296,793 B1
(45) Date of Patent: Oct. 2, 2001

US006296793B1

(54) COMPOSITION FOR PREPARING WATER-REPELLENT COATINGS ON OPTICAL SUBSTRATES

(75) Inventors: Uwe Anthes, Erbach; Reiner Dombrowski, Höchst, both of (DE)

(73) Assignee: Merck Patent Gesellschaft mit, Darmstadt (DE)

( * ) Notice: Subject to any disclaimer, the term of this patent is extended or adjusted under 35 U.S.C. 154(b) by 0 days.

(21) Appl. No.: 09/325,796

(22) Filed: Jun. 4, 1999

(30) Foreign Application Priority Data

Jun. 5, 1998 (DE) .............................. 198 25 100

(51) Int. Cl.⁷ .............................. C23C 16/24; B29C 43/00

(52) U.S. Cl. .................. 264/104; 118/715; 252/502; 252/512; 252/516; 264/1.7; 264/105; 264/614; 264/669; 264/125; 427/162; 427/167; 427/255.6

(58) Field of Search ..................................... 264/1.33, 1.1, 264/2.7, 1.7, 104, 105, 1.36, 614, 669, 122, 125; 427/162, 167, 294, 248.1, 255.6; 252/502, 512, 516; 118/715

(56) References Cited

U.S. PATENT DOCUMENTS

| 4,410,563 | * | 10/1983 | Richter et al. .................. 427/163 |
| 5,853,800 | | 12/1998 | Dombrowski et al. . |
| 6,087,014 | * | 7/2000 | Dombrowski . |

FOREIGN PATENT DOCUMENTS

| 4-355404 | 5/1991 | (JP) . |
| 4355404 | 12/1992 | (JP) . |
| 5-215905 | 8/1993 | (JP) . |
| 5215905 | 8/1993 | (JP) . |

* cited by examiner

*Primary Examiner*—Mathieu D. Vargot
(74) *Attorney, Agent, or Firm*—Millen White Zelano & Branigan, P.C.

(57) ABSTRACT

Composition for preparing water-repellent coatings on optical substrates, comprising a porous, electrically conductive molding and an organosilicon compound, obtainable by mixing an electrically conductive or semiconductive support material with a binder and subjecting the mixture to compression molding to form a compression molding, sintering the compression molding at preferably 1100 to 1500° C. in air to form a porous molding, impregnating the molding with the organosilicon compound, and ageing the impregnated molding by storage in air for at least 3 days.

30 Claims, No Drawings

COMPOSITION FOR PREPARING WATER-REPELLENT COATINGS ON OPTICAL SUBSTRATES

SUMMARY OF THE INVENTION

The invention relates to a composition for preparing water-repellent (hydrophobic) coatings on optical substrates and to the substrates which bear these coatings.

Methods exist to provide the surface of optical components with thin coatings in order to protect them or to obtain certain functional properties. By such optical components are meant primarily lenses for optics, spectacles, cameras, telescopes, binoculars or other optical devices, beam splitters, prisms, mirrors, window panes, etc. One aim of such coatings is to upgrade the surface of optical substrates in such a way that, by hardening and/or increasing chemical resistance, mechanical, chemical or environmental damage is avoided. This is especially important in the case of substrates comprising polymer materials. A second aim of using surface coatings is to reduce reflection, especially in the case of lenses for spectacles and cameras. In this case, given an appropriate choice of coating materials, coat thickness, single-layer structure or multilayer structure from the same or different materials with different refractive indices, it is possible to achieve a reduction in the reflection to less than about 1% over the entire spectrum of visible radiation.

Quality-enhancing and antireflection layers are produced using numerous materials of oxide type, such as $SiO_2$, $TiO_2$, $ZrO_2$, MgO and $Al_2O_3$, fluorides, such as $MgF_2$, and mixtures of these substances. The coating of optical substrates is commonly accomplished by high-vacuum vapor deposition. Here, the substrate and an initial charge comprising the substance to be applied are placed in an appropriate high-vacuum vapor deposition apparatus, which is then evacuated, and the substance is then evaporated by heating and/or electron beam evaporation and is deposited as a thin layer on the substrate surface. Corresponding apparatus and techniques have been described.

Quality-enhancing layers of this kind, especially antireflection layers, however, are extremely sensitive to soiling by, for example, wet or greasy fingerprints. Impurities greatly increase the reflection; fingerprints, therefore, become clearly visible. Effective cleaning to restore the original level of reflection is difficult. For this reason it has become established practice to provide optical components additionally with a hydrophobic, i.e. water-repellent, coating.

To render the surface of optical substrates hydrophobic a range of substances is available, especially from the class of the organosilicon compounds. Examples of such compounds are silanes, siloxanes, silicones, and silicone oils. These substances are generally applied to the target substrate surfaces by dipping or spin coating, and are employed either in pure form or as solutions. Surface treatment and the removal of any solvent by evaporation are generally followed by a thermal aftertreatment, which strengthens the water-repellent coating and causes it to adhere to the substrate material. The resulting coatings generally have satisfactory properties in terms of hydrophobicization, durability and long-term adhesion.

Many methods of coating surfaces of optical substrates with hydrophobicizing agents have disadvantages. For example, in the case of dip and spin coating it is necessary to work under strict clean room conditions in order to rule out adverse effects on quality caused, for instance, by dust particles. Moreover, these techniques require additional operations with corresponding plant and machinery.

JP 05-215 905 discloses a process for producing water-repellent coatings on optical substrates which involves applying fluoroalkylsilazane compounds to the substrate surface by means of the high-vacuum vapor deposition technique. This process has advantages over the customary dip and spin coating techniques in that it can readily be carried out in existing high-vacuum vapor deposition apparatus—for instance, directly following the vapor coating of the substrate with antireflection layers or other quality-enhancing layers. The perfluoroalkylsilazane compounds are preferably introduced in the form of a porous metallic sintered structure impregnated with the substance.

JP 04-355 404 likewise describes a metallic sintered structure for absorbing the organosilicon compounds that are used as the coating material.

JP 08-143 332 describes steel wool instead of metallic sintered structures as a carrier material for the organosilicon compounds that are to be evaporated.

DE 195 39 789 discloses a sintered structure of inorganic oxides for absorbing fluoroalkylsilanes in order to produce water-repellent layers. See also, U.S. Pat. No. 5,853,800.

The sintered structures impregnated with the coating material are introduced into a high-vacuum vapor deposition unit and then the coating material is vapor-coated in a resistance-heated boat or with the aid of an electron beam. Where an electron beam evaporator is used, these sintered structures have considerable disadvantages or are even impossible to use. A sintered structure of oxide type acts as an insulator, becomes electrostatically charged, and heats up suddenly only when the output of the electron beam is increased, so rendering controlled evaporation of the coating material impossible. In some cases the sintered material evaporates as well, thereby preventing the formation of water-repellent layers. When using the highly temperature-stable fluoroalkylsilanes it is impossible to employ metallic sintered structures or steel wool. When using less temperature-stable silicon compounds, however, there is also a risk that parts of the metal structure will be evaporated as well and adversely affect the function of the water-repellent layer.

An object of the invention is to provide a composition for preparing water-repellent coatings on optical substrates, whose support material is a good electrical conductor and possesses a high vaporization temperature, so that it is suitable for application of a wide variety of coating materials.

This object is achieved in accordance with the invention by a composition for preparing water-repellent coatings on optical substrates, comprising a porous, electrically conductive molding and an organosilicon compound and obtainable by
a) mixing an electrically conductive or semi-conductive support material and a binder,
b) subjecting the mixture to compression molding and sintering to form a porous molding,
c) impregnating the molding with the organosilicon compound, and
d) ageing the impregnated molding by storage in air.

It is believed, without being restricted to theory, that the organosilicon compound is cleaved by ageing.

Upon further study of the specification and appended claims, further objects and advantages of this invention will become apparent to those skilled in the art.

The invention additionally provides optical substrates with a coating applied using the composition of the invention by vapor deposition in a high vacuum.

It has been found that porous moldings of an electrically conductive or semi-conductive material are highly suitable as supports for organosilicon compounds and that the organosilicon compounds can be evaporated from them at a readily controllable rate by heating, e.g., with an electron beam. It has also been found that moldings consisting only of one metal cannot be used for highly temperature-stable compounds. By moldings are meant for the purposes of the invention, for example, tablets or granules having a particle size of from about 1 to 4 mm.

The electrically conductive material of the invention comprises a conductive metal oxide, carbide, nitride or silicide; carbon; a metal powder; or a mixture thereof. Metal powders, however, can be used only in a mixture with an electrically non-conductive material.

The conductive metal oxide is preferably tin dioxide, which may be doped with antimony, fluorine, phosphorus, niobium or tantalum. However, it is also possible to employ semiconductors, such as indium oxide, for example.

When using carbides, such as titanium carbide, chromium carbide and tungsten carbide, it is preferable to add small amounts of aqueous ammonia to the organosilicon compound.

Suitable nitrides are chromium nitride and tungsten nitride, for example.

Suitable silicides are, e.g., molybdenum silicide, titanium silicide and chromium silicide. Suitable metal powders are, e.g., powders of the metals titanium, zirconium, silicon chromium, nickel and iron. The particle size is preferably below about 40 $\mu$m. Carbon is likewise suitable as a conductive material, in the form of graphite moldings or granules of activated carbon.

As electrically non-conductive material, use is made, e.g., of silicon oxide, aluminium oxide, zirconium oxide, aluminium silicate, or mixtures thereof.

Preference is given to moldings comprising about 50 to 90% by weight of an electrically non-conductive material and about 10 to 50% by weight of a metal powder.

A particularly preferred molding for the purposes of the invention comprises about 40 to 60% by weight of aluminum silicate and about 20 to 60% by weight of silicon powder.

Organosilicon compounds used are compounds of formula I

$$C_nF_{2n+1}-(CH_2)_m-Si(R^1R^2R^3) \quad (I)$$

in which
$R^1$ is alkoxy of 1 to 3 carbon atoms or $C_nF_{2n+1}-(CH_2)_m-Si(R^2R^3)-O-$
$R^2, R^3$ are each independently alkyl or alkoxy of 1 to 3 carbon atoms
n is from 1 to 12 and
m is from 1 to 6.

In the organosilicon compounds of formula I one radical is a polyfluoroalkyl group composed of a terminal perfluoroalkyl group of 1 to 12 carbon atoms which is attached via an alkylene group of 1 to 6 carbon atoms to the silicon atom. Of the other radicals joined to the silicon atom, $R^1$, $R^2$ and $R^3$, at least one radical ($R^1$) can be an alkoxy group of 1 to 3 carbon atoms. The other radicals ($R^2$ and $R^3$) can be alkyl or alkoxy groups each of 1 to 3 carbon atoms. The radical $R^1$ may also be a siloxy group in which one radical is an above-described polyfluoroalkyl group. The two other radicals joined to the silicon atom ($R^2$ and $R^3$) can in turn be the alkyl or alkoxy groups already defined. Examples of typical compounds of formula I are triethoxy(3,3,4,4,5,5,6,6,7,7,7-undecafluoroheptyl)-silane
triethoxy(3,3,4,4,5,5,6,6,7,7,8,8,8-tridecafluorooctyl-silane
triethoxy(3,3,4,4,5,5,6,6,7,7,8,8,9,9,10,10,10-heptadecafluorodecyl)silane
diethoxymethyl(3,3,4,4,5,5,6,6,7,7,8,8,9,9,10,10,10-heptadecafluorodecyl)silane
bis[ethoxymethyl(3,3,4,4,5,5,6,6,7,7,8,8,8-tridecafluorooctyl)]silyl ether The compounds of the formula I are known per se and the majority of them are obtainable commercially. Some silanes are available, e.g., from Dyneon (Germany) ABER (Germany), Fluorochem (Great Britain), Celest (USA) or Shin-Etsu (Japan). Otherwise, they are readily obtainable by known preparation processes.

The compounds of the formula I are exceptionally stable, especially on storage.

It has been found that they can readily be evaporated in a high vacuum at temperatures of about 300 to 500° C. and deposited on substrate surfaces to form thin layers. In this process the compounds of the formula I either do not decompose or do so to give products which are in no way aggressive or corrosive to optical substrates or to the components of high-vacuum vapor deposition units, vacuum pumps and pump oils.

Further suitable compounds are the organosilicon compounds described in Japanese Patent Application No. H06-122 778.

The porous, electrically conductive moldings are produced by mixing the support material with a binder and subjecting the mixture to compression molding in an eccentric press to give tablets or granules. The binders used are common binders such as, e.g., polyvinyl alcohol, glycerol, methylcellulose, dextrin and waxes, including polymer waxes. The concentration of the binder in the compression molding is about 1 to 20% by weight. The tablets preferably have a diameter of about 10 to 15 mm and a height of about 5 to 10 mm. The granules preferably have a particle size of about from 1 to 4 mm. The particle size of the support material employed is below about 40 $\mu$m, preferably about 5 to 20 $\mu$m.

Subsequently, the compression moldings are heated first in air at about 400 to 600° C. in order to remove the binder and then are calcined in air at about 900 to 1500° C., (e.g., 900 to 1400° C.) preferably about 1100–1500° C., for a period of about 1 to 10 hours. The resultant moldings are hard and durable and have a porosity of about 20 to 60%, preferably about 20 to 50%.

In a subsequent step the porous moldings are laden with the organosilicon compounds. This is done by impregnation with or dropwise application of substantially pure compounds or solutions of these compounds.

It is judicious to load the moldings with predetermined amounts of compounds of formula I, since quantitative determination of the level of each such loaded structure makes it easy to predetermine the layer thickness of the optical substrate to be coated.

In a fourth production stage, the moldings loaded with the organosilicon compounds are dried in air and then aged in air at room temperature for at least about 3 days, preferably about 7 days.

For the deposition of water-repellent layers on optical substrates by means of the composition of the invention it is possible to employ high-vacuum vapor deposition units as are customary for producing optical layers, such as, in particular, antireflection layers or quality-enhancing layers for surface hardening. Here, the molding impregnated with the organosilicon compound is introduced into the apparatus in place of the other vapor deposition materials. It is judicious to carry out the vapor deposition step with the aid of the composition of the invention directly after vapor deposition steps whose purpose, for instance, is to apply antireflection layers; in this case, the substrate is already located in the unit.

After the molding impregnated with the organosilicon compound has been introduced into a conventional high-vacuum vapor deposition unit and a stable final vacuum has been attained in the range, for instance, of about $10^{-3}$ to $10^{-5}$ mbar, the silicon compound is vaporized by heating at temperatures of about 300 to 500° C. or with the aid of an electron beam.

In the course of the process, the compound deposits on the surface of the optical substrate to form a thin layer. In order to improve the adhesion of the layer it may be judicious to heat the substrate to a temperature of about 50 to 300° C. The achievable layer thickness is dependent on the duration of the process or, in the case of quantitative vaporization, on the amount of compound initially introduced. Thicknesses of about 2 to 200 nm are commonly established for water-repellent coatings of this kind.

The water-repellent coatings produced with the said silicon compounds exhibit a number of unpredictable advantages over the coatings known to date. In addition to the fact that the coatings exhibit excellent water-repellent behavior, they are considerably more resistant to mechanical and chemical influences. They are substantially more durable and more firmly adhering; their resistance to wiping and scratching, and their stability to humid air, physiological saline solution, elevated temperature and exposure to UV radiation, are substantially higher than coatings produced using prior art materials and processes.

Water-repellent layers of the compounds specified can be applied to all optical substrates of whatever type. Their use is particularly advantageous on optical substrates which have been provided beforehand with thin layers to enhance the surface and/or to reduce reflection.

The water-repellent layer forms a wetting angle of about 100 to 120° with respect to water. Water droplets drip in bead form from the layer. Dirt, such as fingerprints, can easily be wiped off.

The composition of the invention has the advantage that as a consequence of its electrical conductivity it can be employed without problems in electron beam vaporizers. It conducts the electrical current and so can be heated uniformly with an electron beam. This allows very precise control over the vaporization of the organosilicon compounds.

The composition of the invention can be filled directly into a crucible of the electron beam vaporizer without the use of additional crucibles. Owing to its granular or tablet form it can be employed without difficulty in combination with automatic refill systems.

The examples which follow are intended to illustrate the invention without restricting it.

In the foregoing and in the following examples, all temperatures are set forth uncorrected in degrees Celsius; and, unless otherwise indicated, all parts and percentages are by weight.

The entire disclosure of all applications, patents and publications, cited above and below, and of corresponding German Application No. 198 25 100.9 filed Jun. 5, 1998, is hereby incorporated by reference.

EXAMPLES

Example 1

A mixture of 60% by weight of mullite (aluminium silicate) and 40% by weight of silicon powder is admixed with 2% by weight of polyvinyl alcohol as binder. An eccentric press is used to produce tablets from the mixture, having a diameter of 13 mm and a height of 7 mm. The tablets are first calcined in air at from about 400 to 600° C. in order to remove the binder. The tablets are subsequently calcined at from 1100 to 1150° C. Then the tablets are hard and durable. Thereafter, the tablets are impregnated with 0.3 ml of a mixture of 1 part by volume of triethoxy(3,3,4,4,5,5,6,6,7,7,7-undecafluoroheptyl)-silane and 3 parts by volume of 2-propanol. The doped tablets are dried in air and aged for 7 days.

Example 2

Granules are prepared from silicon carbide, with a particle size of about 1–4 mm. This is done by mixing silicon carbide powder with a binder and granulating the mixture. The granules are calcined first at about 400 to 600° C. in air in order to remove the binder and subsequently are calcined at from 1400 to 1500° C. Then the granules are hard and durable.

For doping, a solution of 1 part by volume of triethoxy (3,3,4,4,5,5,6,6,7,7,7-undecafluoroheptyl)-silane and 1 part by volume of 2-propanol is admixed with 15% by volume of 10% aqueous ammonia. Following a reaction period of 15 minutes the granules are doped by dipping them into the solution. Dipping is carried out for 5 minutes. Then the granules are removed from the solution. The granules are dried in air and aged for 7 days.

Example 3

The preparation of the water-repellent layer is carried out in a vapor deposition unit as employed in the prior art for the coating of glass or plastic lenses with antireflection coats. For this purpose a tablet is inserted into a crucible of a conventional electron beam vaporizer. The cleaned substrates (mineral glass or plastic glass) are fastened to the substrate holder. The unit is evacuated to about $2 \times 10^{-5}$ mbar and then a prior art antireflection layer is produced, consisting for example of 5 layers of a substance of high refractive index, such as zirconium dioxide, in alternation with a substance of low refractive index, such as silicon dioxide. The final layer consists conventionally of silicon dioxide.

To this layer is then applied the water-repellent layer, by heating the tablet in accordance with Example 1 with an electron beam to a temperature of from about 300 to 400° C. The water-repellent layer is vapor-deposited to a thickness of 5–20 nm.

Vaporization can also be carried out from a commercially available boat of sheet molybdenum or tantalum which is heated directly by the passage of current.

The preceding examples can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

We claim:

1. A composition for preparing water-repellent coatings on optical substrates, comprising a porous, electrically conductive molding and an organosilicon compound, obtainable by
   a) mixing an electrically conductive or semiconductive support material comprising carbon; a conductive metal oxide, carbide, nitride or silicide; a metal powder and a non-conductive material; or a mixture thereof with a binder and subjecting the mixture to compression molding to form a compression molding,
   b) sintering the compression molding at from 1100 to 1500° C. in air to form a porous molding,
   c) impregnating the molding with the organosilicon compound, and
   d) ageing the impregnated molding by storage in air for at least 3 days.

2. A composition for preparing a water-repellant coating on an optical substrate, wherein said composition comprises:
   a porous, electrically conductive molding and an organosilicon compound,
   wherein said composition is obtained by ageing a sintered compression molding which is impregnated with an organosilicon compound,
   and wherein said electrically conductive molding comprises carbon;
   a conductive metal oxide, carbide, nitride or silicide; a metal powder and a nonconductive material; or a mixture thereof.

3. The composition of claim 2, wherein said ageing is performed for a time sufficient to cleave said organosilicon compound.

4. A composition for preparing a water-repellant coating on an optical substrate, comprising an organosilicon compound and a porous, electrically conductive molding, wherein said electrically conductive molding comprises
   a) an electrically conductive metal oxide, carbide, nitride or silicide,
   b) carbon,
   c) a metal powder and a non-conductive material, or
   d) a mixture thereof.

5. The composition according to claim 2, wherein said organosilicon compound is of formula I $$C_nF_{2n+1}-(CH_2)_m-Si(R^1R^2R^3) \quad (I)$$

wherein
   $R^1$ is an alkoxy of 1 to 3 a carbon atoms or $C_nF_{2n+1}-(CH_2)_m-Si(R^2R^3)-O-$,
   $R^2$ and $R^3$ are each independently alkyl or alkoxy of 1 to 3 carbon atoms,
   n is 1 to 12 and
   m is 1 to 6.

6. The composition according to claim 2, wherein said conductive metal oxide is indium oxide or tin dioxide which is optionally doped with antimony, fluorine, phosphorus, niobium or tantalum.

7. The composition according to claim 2, wherein said metal carbide is titanium carbide, chromium carbide or tungsten carbide.

8. The composition according to claim 2, wherein said metal nitride is chromium nitride or tungsten nitride.

9. The composition according to claim 2, wherein said metal silicide is molybdenum silicide, titanium silicide, or chromium silicide.

10. The composition according to claim 2, wherein said metal powder is titanium, zirconium, silicon, chromium, nickel or iron.

11. The composition according to claim 2, wherein said non-conductive material is silicon oxide, aluminum oxide, zirconium oxide, aluminum silicate or a mixture thereof.

12. The composition according to claim 2, wherein said organosilicon is triethoxy (3,3,4,4,5,5,6,6,7,7,7-undecafluoroheptyl)silane.

13. The composition according to claim 2, wherein said organosilicon is triethoxy (3,3,4,4,5,5,6,6,7,7,8,8,8-tridecafluorooctyl)silane.

14. The composition according to claim 2, wherein said organosilicon is triethoxy (3,3,4,4,5,5,6,6,7,7,8,8,9,9,10,10,10-heptadecafluorodecyl)silane.

15. The composition according to claim 2, wherein said organosilicon is diethoxymethyl (3,3,4,4,5,5,6,6,7,7,8,8,9,9,10,10,10-heptadecafluorodecyl)silane.

16. The composition according to claim 2, wherein said organosilicon is bis[ethoxymethyl(3,3,4,4,5,5,6,6,7,7,8,8,8-tridecafluorooctyl) silyl ether.

17. The composition according to claim 2, wherein said electrically conductive molding comprises 50 to 90% by weight of an electrically non-conductive material and 10 to 50% by weight of a metal powder.

18. The composition according to claim 2, wherein said electrically conductive molding comprises 40 to 60% by weight of aluminum silicate and 20 to 60% by weight of silicon powder.

19. A method of making a composition for preparing a water-repellent coating on an optical substrate, comprising:
   a) mixing an electrically conductive or semiconductive support material comprising carbon; a conductive metal oxide, carbide, nitride or silicide; a metal powder and a non-conductive material; or a mixture thereof with a binder and subjecting the mixture to compression molding to form a compression molding,
   b) sintering the compression molding at from 1100 to 1500° C. in air to form a porous molding,
   c) impregnating the molding with the organosilicon compound, and
   d) ageing the impregnated molding.

20. A method of making a composition for preparing a water-repellant coating on an optical substrate, comprising ageing a sintered compression molding of carbon, or a conductive metal oxide, carbide, nitride or silicide, or a metal powder and a non-conductive material, or a mixture thereof, which is impregnated with an organosilicon compound.

21. The method according to claim 19, wherein said binder is polyvinyl alcohol, glycerol, methylcellulose, dextrin or a wax, and the concentration of said binder in said compression molding is 1–20% by weight.

22. The method according to claim 20, wherein said compression molding is in the form of a tablet which has a diameter of 10–15 mm and a height of 5–10 mm, or in the form of a granule which has a particle size of 1–4 mm, and/or wherein said porous molding has a porosity of 40–60%.

23. The method according to claim 19, further comprising heating said compression molding in air at 400–600° C. before sintering it at 1100–1500° C.

24. A method for coating an optical substrate with a water-repellant coating, comprising subjecting a composition of claim 2 to a vacuum $10^{-5}14\ 10^{-3}$ mbar and a temperature of 300–500° C., thereby vaporizing said organosilicon compound from such composition, and depositing said vaporized organosilicon compound on said substrate by vapor deposition.

25. The composition according to claim 4, wherein said organosilicon compound is of formula I

$$C_nF_{2n+1}-(CH_2)_m-Si(R^1R^2R^3) \quad (I)$$

wherein

R$^1$ is an alkoxy of 1 to 3 a carbon atoms or $C_nF_{2n+1}-(CH_2)_m-Si(R^2R^3)-O-$, R$^2$ and R$^3$ are each independently alkyl or alkoxy of 1 to 3 carbon atoms, n is 1 to 12 and m is 1 to 6.

26. The composition according to claim 4, wherein said metal powder is titanium, zirconium, silicon, chromium, nickel or iron.

27. The composition according to claim 4, wherein said non-conductive material is silicon oxide, aluminum oxide, zirconium oxide, aluminum silicate or a mixture thereof.

28. The composition according to claim 5, wherein said electrically conductive molding comprises 50 to 90% by weight of an electrically non-conductive material and 10 to 50% by weight of a metal powder.

29. The composition according to claim 4, wherein said electrically conductive molding comprises 40 to 60% by weight of aluminum silicate and 20 to 60% by weight of silicon powder.

30. The composition according to claim 1, wherein said electrically conductive molding comprises an electrically conductive material with the exception of a metal, or a mixture of an electrically conductive material and an electrically non-conductive material.

* * * * *

UNITED STATES PATENT AND TRADEMARK OFFICE
CERTIFICATE OF CORRECTION

PATENT NO. : 6,296,793 B1
DATED : October 2, 2001
INVENTOR(S) : Anthes et al.

It is certified that error appears in the above-identified patent and that said Letters Patent is hereby corrected as shown below:

Column 7,
Line 11, reads "-sion molding to form a compression molding" should read
-- -sion to form a compression molding --

Column 8,
Line 37, reads "-sion molding to form a compression molding" should read
-- -sion to form a compression molding --
Line 65, reads "vacuum $10^{-5}$ 14 $10^{-3}$ mbar" should read -- vacuum $10^{-5}$-$10^{-3}$ mbar --

Column 9,
Line 6, "$C_nF_{2n+1}$—$(CH_2)_{m-Si(R}{}^1R^2R^3)$" should read -- $C_nF_{2n+1}$—$(CH_2)_m$-$Si(R^1R^2R^3)$ --

Signed and Sealed this

Third Day of December, 2002

JAMES E. ROGAN
*Director of the United States Patent and Trademark Office*